United States Patent
Iwasaki et al.

(10) Patent No.: US 6,448,155 B1
(45) Date of Patent: Sep. 10, 2002

(54) PRODUCTION METHOD OF SEMICONDUCTOR BASE MATERIAL AND PRODUCTION METHOD OF SOLAR CELL

(75) Inventors: Yukiko Iwasaki; Takao Yonehara, both of Atsugi; Shoji Nishida, Hiratsuka; Kiyofumi Sakaguchi, Yokohama; Noritaka Ukiyo, Atsugi, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/592,559

(22) Filed: Jun. 12, 2000

(30) Foreign Application Priority Data

Jun. 17, 1999 (JP) ............................................. 11-171135

(51) Int. Cl.⁷ ............................................ H01L 21/301
(52) U.S. Cl. ........................ 438/464; 438/406; 438/455
(58) Field of Search ................................ 438/455, 456, 438/457, 459, 458, 406, 407, 408, 409

(56) References Cited

U.S. PATENT DOCUMENTS

| 5,811,348 A | 9/1998 | Matsushita et al. | 438/455 |
| 5,856,229 A | 1/1999 | Sakaguchi | 438/406 |
| 6,100,165 A | * 8/2000 | Sakaguchi | 438/455 |
| 6,143,628 A | * 11/2000 | Sato et al. | 438/455 |
| 6,156,624 A | * 12/2000 | Yamagata | 438/459 |

FOREIGN PATENT DOCUMENTS

| EP | 0851513 | 7/1998 |
| JP | 7-302889 | 11/1995 |
| JP | 8-213645 | 8/1996 |
| JP | 10-189924 | 7/1998 |
| JP | 10-190029 | 7/1998 |

OTHER PUBLICATIONS

R.P. Holmstrom et al.; Applied Physics Letters; "Complete Dielectric Isolation by Highly Selective and Self–Stopping Formation of Oxidized Porous Silicon"; Feb. 15, 1983; vol. 42, No. 4, pp.386–388.

Takashi Unagami; Journal of the Electrochemical Society; "Formation Mechanism of Porous Silicon Layaer by Anodization in HF Solution"; Feb. 1988; vol. 127, No. 2, pp. 476–483.

* cited by examiner

*Primary Examiner*—Hoai V. Ho
*Assistant Examiner*—Dung Anh Le
(74) *Attorney, Agent, or Firm*—Fitzpatrick, Cella, Harper & Scinto

(57) ABSTRACT

When a semiconductor layer formed via a separation layer on a substrate is supported by a support member and a pulling force is then exerted on the support member to mechanically break the separation layer to thereby form a thin-film semiconductor, the substrate is held by vacuum and/or electrostatic attachment and separation of the thin-film epitaxial layer is initiated from an area other than an edge of the substrate. This provides a method capable of obtaining the thin-film epitaxial layer with excellent characteristics in a good yield and permitting repetitive uses of the substrate, without inducing lifting of the substrate due to the separation force overcoming the attaching force of the substrate when producing a semiconductor base material and a solar cell.

36 Claims, 5 Drawing Sheets

PRODUCTION METHOD OF SEMICONDUCTOR BASE MATERIAL AND PRODUCTION METHOD OF SOLAR CELL

BACKGROUND OF THE INVENTION

1. Field of the Invention

The present invention relates to a method of producing a semiconductor base material and, more particularly, to a method of producing a solar cell by depositing a thin-film crystal layer on a low-cost substrate.

2. Related Background Art

There is the known technology of forming a thin-film semiconductor layer on a porous layer formed on a semiconductor substrate, thereafter breaking the porous layer to separate the thin-film semiconductor layer from the substrate, and using the semiconductor substrate after the separation, again for the formation of a thin-film semiconductor layer. Since this technology permits effective utilization of materials, inexpensive thin-film semiconductors can be obtained with good quality. Methods available for the separation include chemical methods by etching, or physical methods making utilizing an action of ultrasonic wave, pulling force, or the like.

Japanese Patent Application Laid-Open No. 7-302889 describes a physical separation method in which an epitaxial layer is grown on a porous layer formed in a surface of a silicon wafer, another wafer is bonded to the epitaxial layer (silicon layer), and a pressure, shearing stress, ultrasonic wave, or the like is applied to the porous layer to effect separation. Japanese Patent Application Laid-Open No. 8-213645 describes another method in which a silicon layer is epitaxially grown on a porous layer formed in the surface of a single-crystal silicon substrate, the back surface of the single-crystal silicon substrate is bonded to a jig with an adhesive, thereafter the epitaxial layer is bonded to another jig with an adhesive, and then a pulling force is applied between these two jigs to obtain a thin-film semiconductor. Japanese Patent Application Laid-Open Nos. 10-189924 and No. 10-190029 describe that the back surface of the single-crystal silicon substrate is fixed to the jig by vacuum attachment (or chucking or suction), another jig is bonded to the epitaxial layer, and the two jigs are separated from each other to break the porous layer, thereby obtaining the thin-film epitaxial layer (and a solar cell using it).

For separating the thin-film epitaxial layer from the original semiconductor substrate by use of peeling force, holding of the substrate is an important factor. For obtaining the thin-film semiconductors at a low cost, the original semiconductor substrate has to be used repeatedly many times. Therefore, the vacuum attachment and/or electrostatic attachment is considered to be a suitable method for holding the semiconductor substrate without damage or contamination thereto, as described in Japanese Patent Applications Laid-Open No. 10-189924 and No. 10-190029. In the methods of initiating peeling from an edge of the substrate while holding the substrate by the vacuum attachment and/or electrostatic attachment, however, when the rupture strength of the porous layer is greater than a certain value, there are possibilities that the substrate-attracting force is defeated by the force necessary for the rupture of the porous layer, which is the pulling force for the separation of the thin-film semiconductor layer, so as to lift the substrate. When the wafer is separated with rolling the support member of the thin-film semiconductor up around a roller, there are also possibilities that the wafer is broken.

SUMMARY OF THE INVENTION

An object of the present invention is to solve the above-stated problems, thereby providing a method capable of obtaining a thin-film epitaxial layer with excellent characteristics in a good yield without lifting of the substrate and permitting repeated uses of the substrate.

The inventors have conducted intensive and extensive studies in order to solve the above problems and finally have accomplished the present invention.

According to the present invention, the substrate is held by vacuum attachment and/or electrostatic attachment and the separation of a thin-film epitaxial layer is initiated from an area except for the periphery of the substrate. By this method, the thin-film epitaxial layer with excellent characteristics can be obtained in a good yield and the substrate can be used repeatedly, thus permitting low-cost production.

BRIEF DESCRIPTION OF THE DRAWINGS

FIGS. 2A and 2B are views showing distribution of force exerted upon a start of separation, wherein FIG. 2A shows an example of the separation of the thin-film semiconductor layer through the porous layer at the edge of the substrate and FIG. 2B shows an example of the separation of the thin-film semiconductor layer through the porous layer in the central part of the substrate;

FIGS. 3A and 3B are views explaining the work in Example 1, wherein FIG. 3A is a plan view and FIG. 3B a cross-sectional view;

FIGS. 4A and 4B are views explaining the work in Example 2, wherein FIG. 4A is a plan view and FIG. 4B a cross-sectional view; and FIGS. 5A and 5B are views explaining the work in Example 3, wherein FIG. 5A is a plan view and FIG. 5B a cross-sectional view.

DESCRIPTION OF THE PREFERRED EMBODIMENTS

Now, preferred embodiments of the present invention will be described by referring to FIGS. 1A to 5B, wherein like elements will be referred to by like numerals.

Figure 1A:
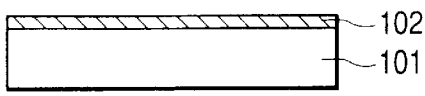
FIGS. 1A, 1B, 1C, 1D, 1E, 1F, 1G, and 1H are step diagrams showing an example of the thin-film semiconductor production process according to the present invention, in which the process according to the present invention is comprised of the steps of FIGS. 1A, 1B, 1C, 1D, 1E, 1F, 1G, and 1H.

A production method of semiconductor base material will be described with reference to FIGS. 1A to 1H, as an embodiment of the present invention. For example, an impurity is introduced into a surface of a single-crystal silicon wafer 101 by a method of thermal diffusion, ion implantation, contamination upon preparation of the wafer, or the like, to form a $p^+$ (or $n^+$) layer 102, at least, in the wafer surface (FIG. 1A).

Figure 1B:
Figure 1C:
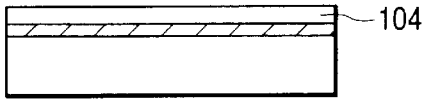

Then the impurity-introduced wafer surface is subjected to anodization, for example, in an HF solution. This makes the surface area porous, thereby forming a porous layer 103 (FIG. 1B). Then an epitaxial layer comprised of single-crystal silicon (hereinafter will be referred to as a single-crystal silicon layer) 104 is grown by liquid phase epitaxy on the surface of the porous layer 103 (FIG. 1C).

During the formation of the porous layer by anodization the anodization current can be changed, for example, midway from a low level to a high level, to preliminarily provide the structure of the porous layer with difference in density, thereby facilitating the separation of the single-crystal silicon layer 104 from the silicon wafer 101 through the porous layer 103 after the epitaxial growth.

Figure 1D:
Figure 1H:
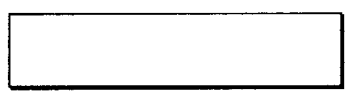
Figure 1E:
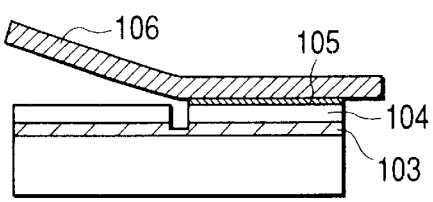
Figure 1F:
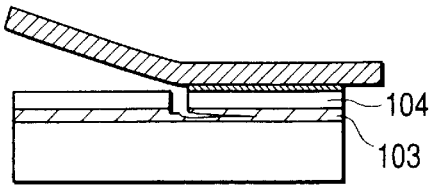
Figure 1G:
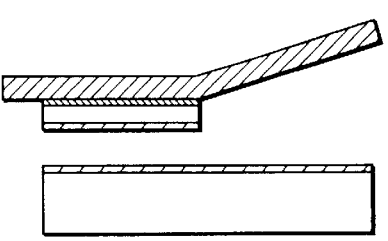
Figure 2A:
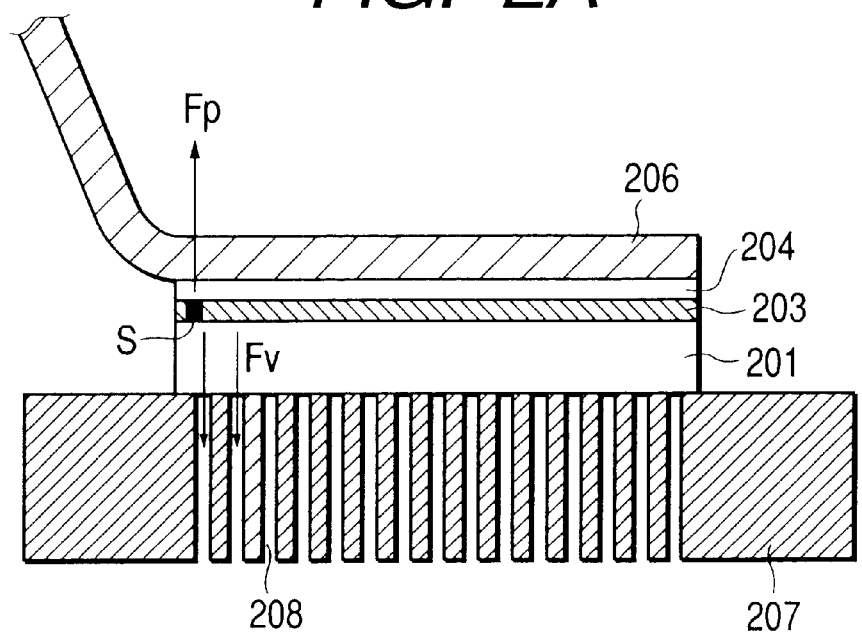
Figure 2B:
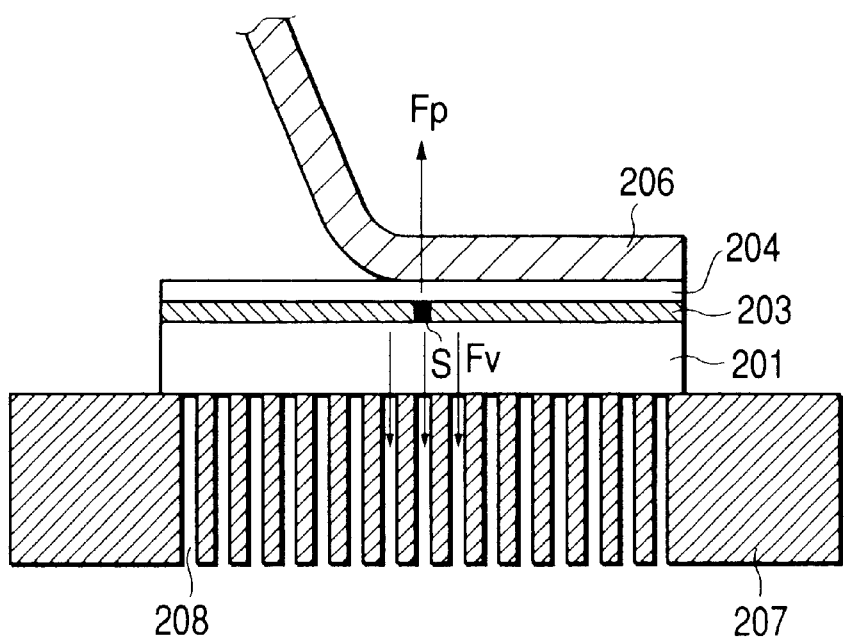

Then the single-crystal silicon layer 104 grown on the porous layer 103 is supported through an adhesive 105 by a support member 106 (FIG. 1E). Then the porous layer 103 is broken to separate the single-crystal silicon layer 104 (FIGS. 1F and 1G). In order to permit repetitive utilization of the silicon wafer, the silicon wafer is held by vacuum attachment of the surface on the side opposite to the side of the single-crystal silicon layer and the separation is initiated from an area except for the periphery of the substrate, for example, from the center of the substrate (FIG. 1D).

When the separation is initiated from the edge of the substrate (FIG. 2A) and from the center of the substrate (FIG. 2B), the separation force Fp and holding force Fv are considered to act, each as illustrated, in the vertical direction in the area around the initial point S. In the figures, reference numeral 207 denotes a substrate holding base and 208 denotes vacuum attaching holes. As apparent from the figures, when the separation is initiated from the edge, the holding force Fv acts only on the central side of the wafer in the area around the initial point S. On the other hand, when the separation is initiated from the center, the even holding force Fv acts in the area around the initial point S, so as to yield a strong holding force. Therefore, even under the holding condition that the lifting of the wafer occurs by the separation from the edge of the wafer, the wafer can be held firmly without lifting by initiating the separation from the area other than the edge.

On the occasion of separating the wafer from the area other than the edge, the separation can be initiated smoothly from a desired position if a portion of the silicon layer is preliminarily removed, at least, in the separation initiating part. For example, when the semiconductor layer is removed along a diameter line of the wafer, the separated region is divided into two areas to form a groove therebetween (FIG. 1D). First, an adhesive is applied onto one area and the support member is bonded thereto (FIG. 1E). Then the separation of the area is effected from the region along the diameter line from which the silicon layer was removed, toward the wafer edge (to the right in the figure) (FIG. 1F) at a predetermined angle. Thereafter, the other remaining area is also separated from the wafer in similar fashion, obtaining a thin-film silicon layer (FIG. 1G).

The single-crystal silicon layers 104 thus separated are used for the semiconductor base materials or solar cells after the residue of the porous layer 103 is removed as the occasion demands.

As for the silicon wafer 101 after completion of the separation, the residue of the porous layer 103 remaining on the surface thereof is removed or treated by etching or the like and then the resultant wafer is brought again into the first step, thus permitting effective utilization thereof (FIG. 1H). Therefore, the vacuum attachment and/or electrostatic attachment without damage to the wafer is preferable as a method of supporting the wafer.

Preferred conditions in the production methods of semiconductor base material and solar cell according to the present invention will be described below in detail. First, the porous layer will be described with an example of silicon. A hydrofluoric acid (HF) solution is preferably used in the anodization method for formation of the porous layer 103, a solution of hydrochloric acid, sulfuric acid, or the like can also be used. With use of the HF solution, the $p^+$ (or $n^+$) layer 102 can be made porous in the HF concentration of not less than 10%. The current flow during the anodization can be properly determined, depending upon the HF concentration, the desired film thickness of the porous layer, the surface condition of the porous layer, or the like, and an appropriate range thereof is approximately 1 mA/cm² to 100 mA/cm².

When an alcohol such as ethyl alcohol or the like is added to the HF solution, bubbles of reaction product gases evolving during the anodization can be eliminated instantly from the reacting surface without agitation, whereby the porous layer can be formed uniformly and efficiently. The amount of the alcohol added is properly determined depending upon the HF concentration, the desired film thickness of the porous layer, or the surface condition of the porous layer, and, particularly, it is necessary to determine the amount of alcohol with such attention as to prevent the HF concentration from becoming too low.

The density of single-crystal silicon is 2.33 g/cm³, but the density of the porous layer can be varied, for example, in the range of 1.1 to 0.6 g/cm³, for example, by changing the concentration of the HF solution in the range of 50 to 20%. The porosity can also be varied by changing the anodization current, and increasing the current will also increase the porosity.

The mechanical strength of the porous layer differs depending upon the porosity and is considered to be sufficiently lower than that of the bulk silicon. For example, supposing the porosity is 50%, the mechanical strength can be considered to be half of that of the bulk. If a substrate were bonded to the surface of the porous layer and if sufficient adhesion were present between the porous layer and the substrate, the porous layer would be broken by a compressive, pulling, or shearing force placed between the silicon wafer with the porous layer formed therein, and the substrate. If the porosity is increased further the porous layer will be able to be broken by a weaker force.

Since holes are necessary for anodic reaction, the porous layer is made mainly by the anodization of p-type silicon in which holes are present (T. Unagami, J. Electrochem. Soc., vol. 127, 476 (1980)). There is, however, also a report that the porous layer can be made of low-resistance n-type silicon, on the other hand (R. P. Holmstrom and J. Y. Chi, Appl. Phys. Lett., vol. 42, 386 (1983)). Therefore, the porous layer is considered to be able to be formed of any low-resistance silicon, independent of the conductivity type, i.e., independent of either the p-type or the n-type. It is also possible to effect selective formation of the porous layer depending upon the conductivity type; for example, only the p-type layer can be made porous by anodization in a dark place as in the FIPOS (Full Isolation by Porous Oxidized Silicon) process.

When observed with a transmission electron microscope, the porous layer (silicon layer) resulting from anodization of single-crystal silicon has pores of a diameter of about several nm and the density of the porous silicon is not more than half the density of the single-crystal silicon. In spite of this fact, the single-crystallinity is maintained, so that an epitaxial layer can be grown on the porous layer (silicon layer) by thermal CVD, liquid phase growth, or the like.

Further, since the porous layer includes a large amount of voids inside thereof, the surface area thereof is dramatically increased in comparison with the volume. As a result, the chemical etching rate thereof is extremely larger than the etching rates of ordinary single-crystal layers.

The porous layer can also be obtained similarly by anodization using polycrystal silicon in place of single-crystal silicon. A crystal silicon layer can be grown thereon by thermal CVD, liquid phase growth, or the like. (In this case, partial epitaxial growth can be implemented corresponding to the sizes of crystal grains of polycrystal silicon.)

EXAMPLES

The following examples are given for the purpose of illustration and not by way of limitation.

Example 1

Boron (B) was introduced by thermal diffusion into one surface of a p-type silicon single-crystal substrate (silicon wafer) 301 having the thickness of 800 μm and the diameter of 4 inches to form the p$^+$ layer. This substrate was anodized at two levels of current in a hydrofluoric acid solution to obtain the porous layer 302 in the thickness of about 10 μm. The current was supplied in the density of 8 mA/cm$^2$ for ten minutes and thereafter in the density of 30 mA/cm$^2$ for one minute. The change of current on the way of the current supply resulted in forming a double-layer structure consisting of a porous layer of dense structure and a porous layer of coarse structure.

Then the p-type silicon single-crystal substrate (silicon wafer) 301 with the porous layer 302 formed therein was annealed at the surface temperature of 1050° C. in a hydrogen atmosphere for one minute. After that, the substrate was immersed in a metal indium solution at 900° C. in which silicon was dissolved to a concentration in a supersaturation state. Then the solution was gradually cooled to form the epitaxial layer (hereinafter referred to as a silicon layer) 303 in the thickness of 30 μm. At this time, the surface of the substrate 301 on the side opposite to the side of the porous layer 302 was covered by an oxide film so as to repel the solution, whereby the silicon layer 303 was formed only on the surface in which the porous layer was formed.

Figure 3A:
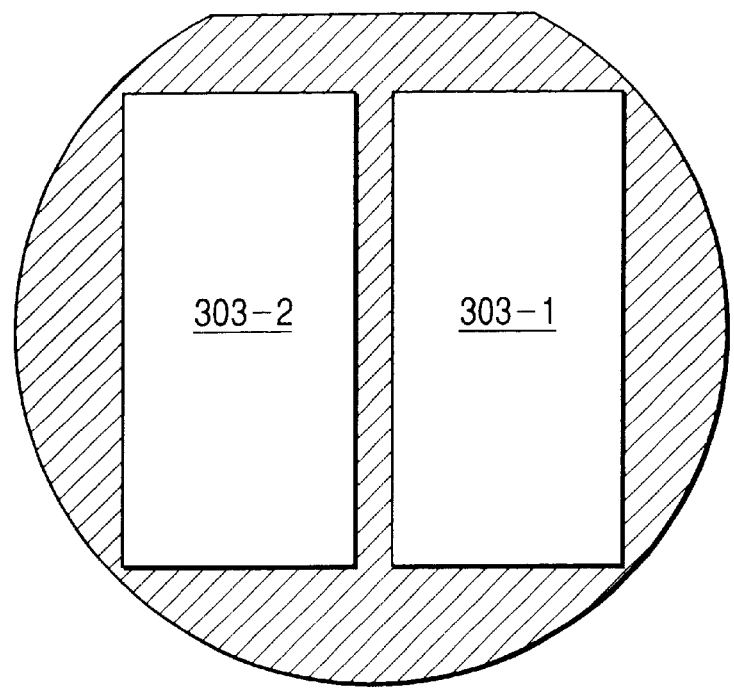
Figure 3B:
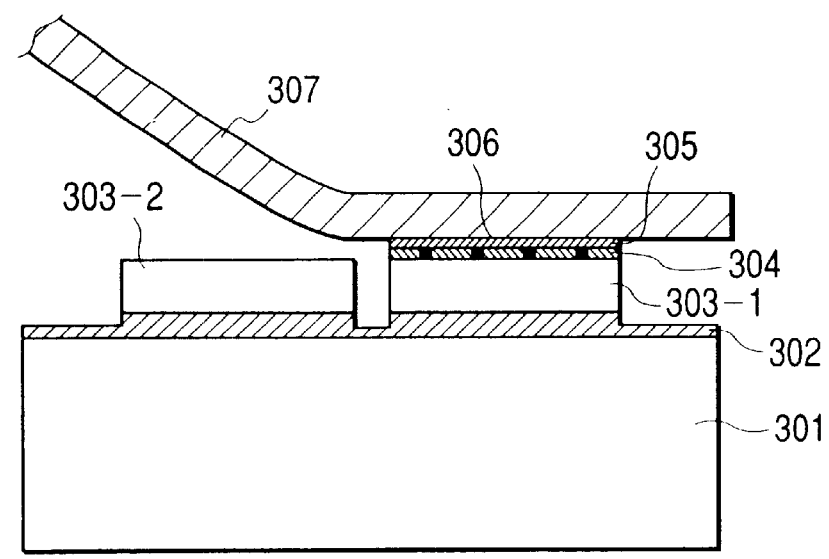

Next, after the wafer was divided into two areas of 70×34 mm$^2$, solar cells were formed therein. First, the two areas 303-1, 303-2 of 70×34 mm$^2$ were masked and dry etching by RIE was carried out to remove an appropriate depth of the porous layer from the surface (FIG. 3A). Then the mask was removed and phosphorus (P) was made to diffuse into the surface of each 70×34 mm$^2$ silicon layer 303 to form the n$^+$ layer. Further, electrodes 304 and antireflection layers 305 were formed thereon. The surface of the substrate 301 on the other side than the solar cell side was held by vacuum attachment and a transparent adhesive 306 was applied onto the surface of the antireflection layer 305 of one silicon layer 303-1 so as not to overflow into the removed portions and removed side surfaces. Then a transparent support member 307 was fixed to the surface and thereafter a force was applied to the porous layer 302 from a part close to the center to separate the silicon layer 303-1 from the silicon substrate 301 (FIG. 3B). A back electrode was formed on the silicon layer, thereby obtaining a thin-film solar cell. Likewise, the remaining silicon layer 303-2 was also treated so as to form the thin-form solar cell. During the separation the thin-film semiconductor layer was able to be separated completely throughout the entire surface without lifting of the wafer.

The residue of the porous layer was removed by etching from the silicon wafer 301 and the silicon wafer 301 was used repeatedly in totally five processes of the above-stated steps. The characteristics of the thin-film solar cells thus obtained were evaluated and it was verified thereby that they demonstrated high efficiency on a stable basis, regardless of the number of uses of the wafer.

Example 2

Figure 4A:
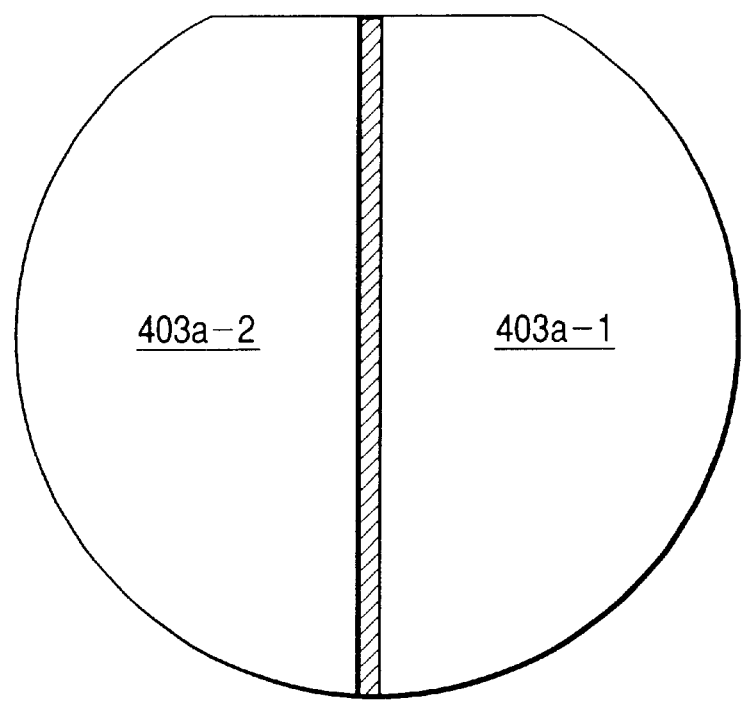
Figure 4B:
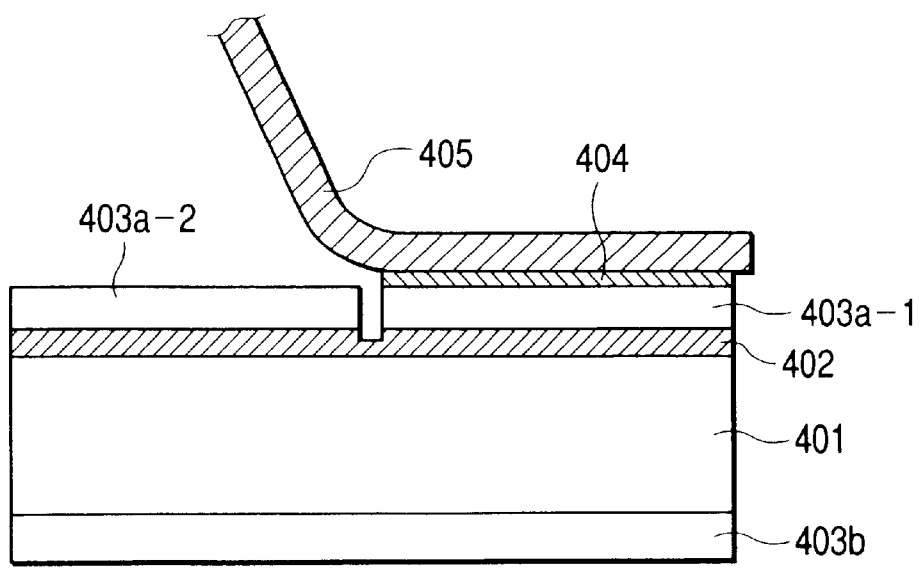

The p$^+$ type silicon wafer 401 of the diameter of 5 inches was subjected to the current supply in the density of 8 mA/cm$^2$ for ten minutes and thereafter in the density of 20 mA/cm$^2$ for two minutes in a manner similar to that in Example 1, to form the porous layer 402 in the double-layer structure, and thereafter the wafer was subjected to epitaxy on the both surfaces thereof by CVD to form epitaxial layers (silicon semiconductor layers) 403a, 403b each in the thickness of 15 μm. Then a diffusing agent was applied onto the surface of the epitaxial layer 403a deposited on the porous layer to form the p$^+$ layer and thereafter the silicon layer was etched away in the width of 3 mm along the diameter of the wafer in the surface of 403a, thereby dividing the region into two areas 403a-1, 403a-2 (FIG. 4A). An etchant used herein was hydrofluoric-nitric acid (HF:HNO$_3$=1:1). A solar cell of 4 cm$^2$ was produced in similar fashion to that in Example 1, on each of the two split areas 403a-1, 403a-2 2 of the epitaxial layer and thereafter a transparent adhesive 404 was applied onto the surface of one layer 403a-1 so as not to overflow. Then the support member 405 was adhered to the surface. While holding the surface of the layer 403b by electrostatic attachment, a pulling force was applied to the support member to initiate the separation from the etching line (FIG. 4B), thereby obtaining the solar cell. The other layer 403a-2 was also separated in similar fashion. At this time, the layer was separated almost throughout the entire surface, without lifting of the wafer. After the residue of the porous layer was removed, the thin-film solar cells thus obtained were stuck to a metal member with an electroconductive adhesive and the characteristics thereof were evaluated.

The residue of the porous layer was removed from the silicon wafer 401 and the silicon wafer 401 was subjected to totally ten repetitions of the above-stated steps. Since the silicon layers were deposited on the both surfaces in every process, the wafer decrease equivalent to the thickness of the porous layer was compensated for thereby and there occurred no difficulties in handling even after many repetitions of the above steps. The characteristics of the solar cells thus obtained were compared and evaluated and it was verified thereby that they demonstrated stable conversion efficiency, independent of the number of uses of the wafer.

Example 3

Figure 5A:
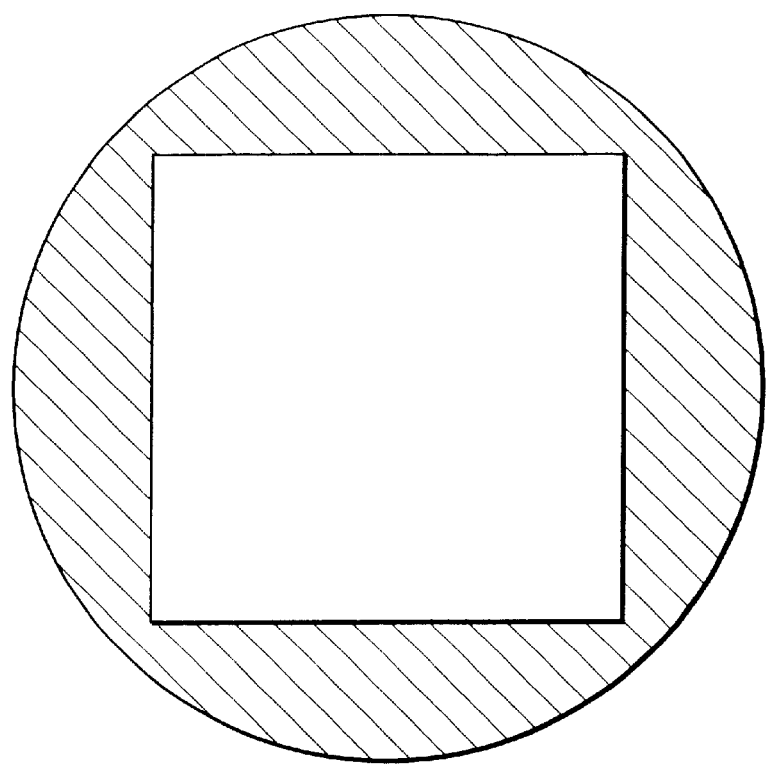
Figure 5B:
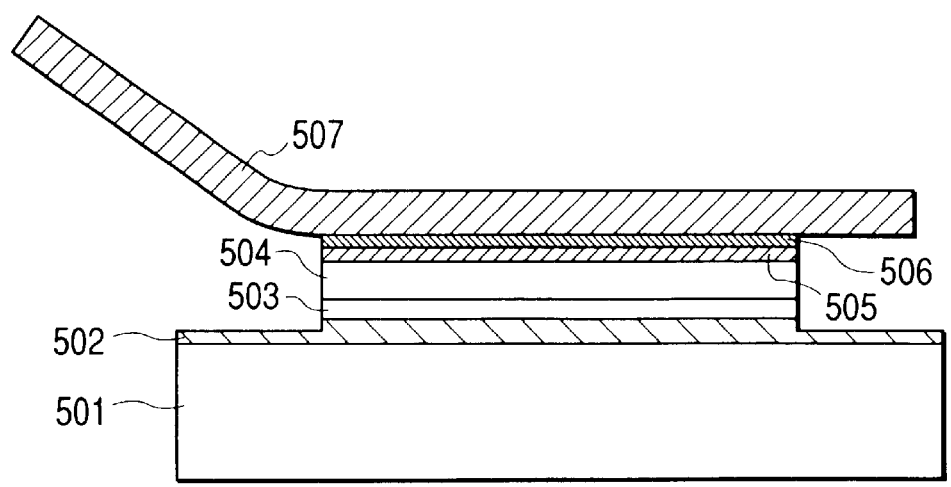

As in Example 1, the p$^+$ layer was formed on the 5-inch silicon wafer 501 and thereafter the anodization was carried out by the current supply in the density of 8 mA/cm$^2$ for ten minutes and thereafter in the density of 25 mA/cm$^2$ for one minute to form the porous layer 502 of the double-layer structure in the thickness of about 12 μm. Then the semiconductor layer was epitaxially grown in the thickness of 0.5 μm on the porous layer 502 and thereafter P (phosphorus) was made to diffuse thereinto to form the n$^+$ layer 503. Further, an epitaxial layer (single-crystal semiconductor layer) 504 was deposited in the thickness of 30 μm by liquid phase growth. Then a resist mask was formed in the square shape of 80 mm×80 mm in the central part of the wafer and dry etching by RIE was effected to remove the epitaxial layers (hereinafter referred to as silicon layers) (FIG. 5A). Then, the resist was removed, and at the same time as thermal welding of a metal member 505 to the remaining silicon layer 504 with an Al foil, Al atoms were made to diffuse into the bonding surface of the silicon layer 504 to form the p$^+$ layer. After that, the back surface was held by a combination of vacuum attachment and electrostatic attachment, and a force was applied to the porous layer 502 to obtain a thin film. At this time, the separation was initiated from a position about 2 cm closer to the center from the edge of the wafer, so that the separation was implemented without lifting of the wafer. The residue of the porous layer remaining on the surface of the thin-film semiconductor layer was removed and a grid electrode was formed thereon. After that, an antireflection film of $TiO_2$ also having the passivation effect was deposited thereon to form a solar cell of 4 cm² and the solar cell was evaluated. The residue of the porous layer was etched away from the wafer after the separation of the thin film, and the wafer was subjected to totally five repetitions of the above-stated steps.

The solar cells thus obtained were compared and evaluated, and it was verified thereby that they demonstrated stable efficiency, regardless of the number of uses of the wafer.

When a semiconductor layer formed via a separation layer on a substrate is supported by a support member, and a pulling force is then exerted on the support member to mechanically break the separation layer to thereby form a thin-film semiconductor, by holding the substrate by vacuum and/or electrostatic attachment and initiating separation of the thin-film epitaxial layer from an area except for an edge of the substrate, it is possible to prevent the separation force from overcoming the attaching force of the substrate to lift the substrate, also to attain a thin-film epitaxial layer with excellent characteristics in a good yield, and further to permit repetitive uses of the substrate, thereby enabling low-cost production.

What is claimed is:

1. A method of producing a semiconductor base material, the method comprising steps of supporting a semiconductor layer formed through a separation layer on a substrate by a support member, holding the substrate, and thereafter applying a pulling force to the support member to mechanically break the separation layer to form a thin-film semiconductor, wherein the pulling force applying step is effected such that separation is initiated from an area other than an edge of the substrate.

2. The method according to claim 1, wherein a thin-film semiconductor layer is separated while holding the substrate by vacuum attachment.

3. The method according to claim 1, wherein a thin-film semiconductor layer is separated while holding the substrate by electrostatic attachment.

4. The method according to claim 1, wherein a thin-film semiconductor layer is separated while holding the substrate by vacuum attachment and electrostatic attachment.

5. The method according to claim 1, wherein the separation layer is a porous layer formed by anodization.

6. The method according to claim 1, wherein the substrate is subjected to repetitive uses.

7. A method of producing a semiconductor base material, the method comprising steps of supporting a semiconductor layer formed through a separation layer on a substrate by a support member, holding the substrate, and thereafter applying a pulling force to the support member to mechanically break the separation layer to form a thin-film semiconductor, wherein the pulling force applying step is effected such that separation is initiated from a position where a force of holding the substrate is greater than the force of pulling the support member.

8. The method according to claim 7, wherein a thin-film semiconductor layer is separated while holding the substrate by vacuum attachment.

9. The method according to claim 7, wherein a thin-film semiconductor layer is separated while holding the substrate by electrostatic attachment.

10. The method according to claim 7, wherein a thin-film semiconductor layer is separated while holding the substrate by vacuum attachment and electrostatic attachment.

11. The method according to claim 7, wherein the separation layer is a porous layer formed by anodization.

12. The method according to claim 7, wherein the substrate is subjected to repetitive uses.

13. A method of producing a semiconductor base material, the method comprising steps of supporting a semiconductor layer formed through a separation layer on a substrate by a support member, holding the substrate, and thereafter applying a pulling force to the support member to mechanically break the separation layer to form a thin-film semiconductor, wherein a groove is formed by removing the semiconductor layer and the porous layer so as to make at least a predetermined angle relative to a separation-proceeding direction and the pulling force applying step is effected such that separation is initiated from the groove.

14. The method according to claim 13, wherein a thin-film semiconductor layer is separated while holding the substrate by vacuum attachment.

15. The method according to claim 13, wherein a thin-film semiconductor layer is separated while holding the substrate by electrostatic attachment.

16. The method according to claim 13, wherein a thin-film semiconductor layer is separated while holding the substrate by vacuum attachment and electrostatic attachment.

17. The method according to claim 13, wherein the separation layer is a porous layer formed by anodization.

18. The method according to claim 13, wherein the substrate is subjected to repetitive uses.

19. A method of producing a solar cell, the method comprising steps of supporting a semiconductor layer formed through a separation layer on a substrate by a support member, holding the substrate, and thereafter applying a pulling force to the support member to mechanically break the separation layer to form a thin-film semiconductor, wherein the pulling force applying step is effected such that separation is initiated from an area other than an edge of the substrate.

20. The method according to claim 19, wherein a thin-film semiconductor layer is separated while holding the substrate by vacuum attachment.

21. The method according to claim 19, wherein a thin-film semiconductor layer is separated while holding the substrate by electrostatic attachment.

22. The method according to claim 19, wherein a thin-film semiconductor layer is separated while holding the substrate by vacuum attachment and electrostatic attachment.

23. The method according to claim 19, wherein the separation layer is a porous layer formed by anodization.

24. The method according to claim 19, wherein the substrate is subjected to repetitive uses.

25. A method of producing a solar cell, the method comprising steps of supporting a semiconductor layer formed through a separation layer on a substrate by a support member, holding the substrate, and thereafter applying a pulling force to the support member to mechanically break the separation layer to form a thin-film semiconductor, wherein the pulling force applying step is effected such that separation is initiated from a position where a force of holding the substrate is greater than the force of pulling the support member.

26. The method according to claim 25, wherein a thin-film semiconductor layer is separated while holding the substrate by vacuum attachment.

27. The method according to claim 25, wherein a thin-film semiconductor layer is separated while holding the substrate by electrostatic attachment.

28. The method according to claim 25, wherein a thin-film semiconductor layer is separated while holding the substrate by vacuum attachment and electrostatic attachment.

29. The method according to claim 25, wherein the separation layer is a porous layer formed by anodization.

30. The method according to claim 25, wherein the substrate is subjected to repetitive uses.

31. A method of producing a solar cell, the method comprising steps of supporting a semiconductor layer formed through a separation layer on a substrate by a support member, holding the substrate, and thereafter applying a pulling force to the support member to mechanically break the separation layer to form a thin-film semiconductor, wherein a groove is formed by removing the semiconductor layer and the porous layer so as to make at least a predetermined angle relative to a separation-proceeding direction and the pulling force applying step is effected such that separation is initiated from the groove.

32. The method according to claim 31, wherein a thin-film semiconductor layer is separated while holding the substrate by vacuum attachment.

33. The method according to claim 31, wherein a thin-film semiconductor layer is separated while holding the substrate by electrostatic attachment.

34. The method according to claim 31, wherein a thin-film semiconductor layer is separated while holding the substrate by vacuum attachment and electrostatic attachment.

35. The method according to claim 31, wherein the separation layer is a porous layer formed by anodization.

36. The method according to claim 31, wherein the substrate is subjected to repetitive uses.

* * * * *

UNITED STATES PATENT AND TRADEMARK OFFICE
CERTIFICATE OF CORRECTION

PATENT NO.     : 6,448,155 B1
DATED          : September 10, 2002
INVENTOR(S)    : Yukiko Iwasaki et al.

It is certified that error appears in the above-identified patent and that said Letters Patent is hereby corrected as shown below:

Title page,
Item [56], References Cited, OTHER PUBLICATIONS, after "Takashi Unagami;", "Layaer" should read -- Layer --.

Column 1,
Line 21, "making" should be deleted.

Column 6,
Line 14, "2 of" should read -- of --.

Signed and Sealed this

Eighth Day of April, 2003

JAMES E. ROGAN
*Director of the United States Patent and Trademark Office*